United States Patent [19]

Scott

[11] 3,973,135
[45] Aug. 3, 1976

[54] CONTROL CIRCUIT WITH END OF CYCLE INDICATION

[75] Inventor: Charles E. Scott, Indianapolis, Ind.

[73] Assignee: P. R. Mallory & Co., Inc., Indianapolis, Ind.

[22] Filed: May 12, 1975

[21] Appl. No.: 576,733

[52] U.S. Cl. .................. 307/141; 219/10.55 B; 340/309.1
[51] Int. Cl.² ............................................ G08B 1/00
[58] Field of Search ............ 219/10.55 B, 10.55 C; 200/38 FA; 307/141, 141 A, 141.4, 11; 340/309.2, 309.3, 309.4, 309.1

[56] References Cited
UNITED STATES PATENTS 3,484,769  12/1969  Ehner .......................... 340/309.3
3,767,937  10/1973  Schmidgall ..................... 307/141

Primary Examiner—Robert K. Schaefer
Assistant Examiner—M. Ginsburg
Attorney, Agent, or Firm—Hoffmann, Meyer & Hanson

[57] ABSTRACT

Two timing means are connected by a switching means, one of the timing means being operable to de-energize a load, the other energizing another load for a predetermined time after the first load has been de-energized.

6 Claims, 1 Drawing Figure

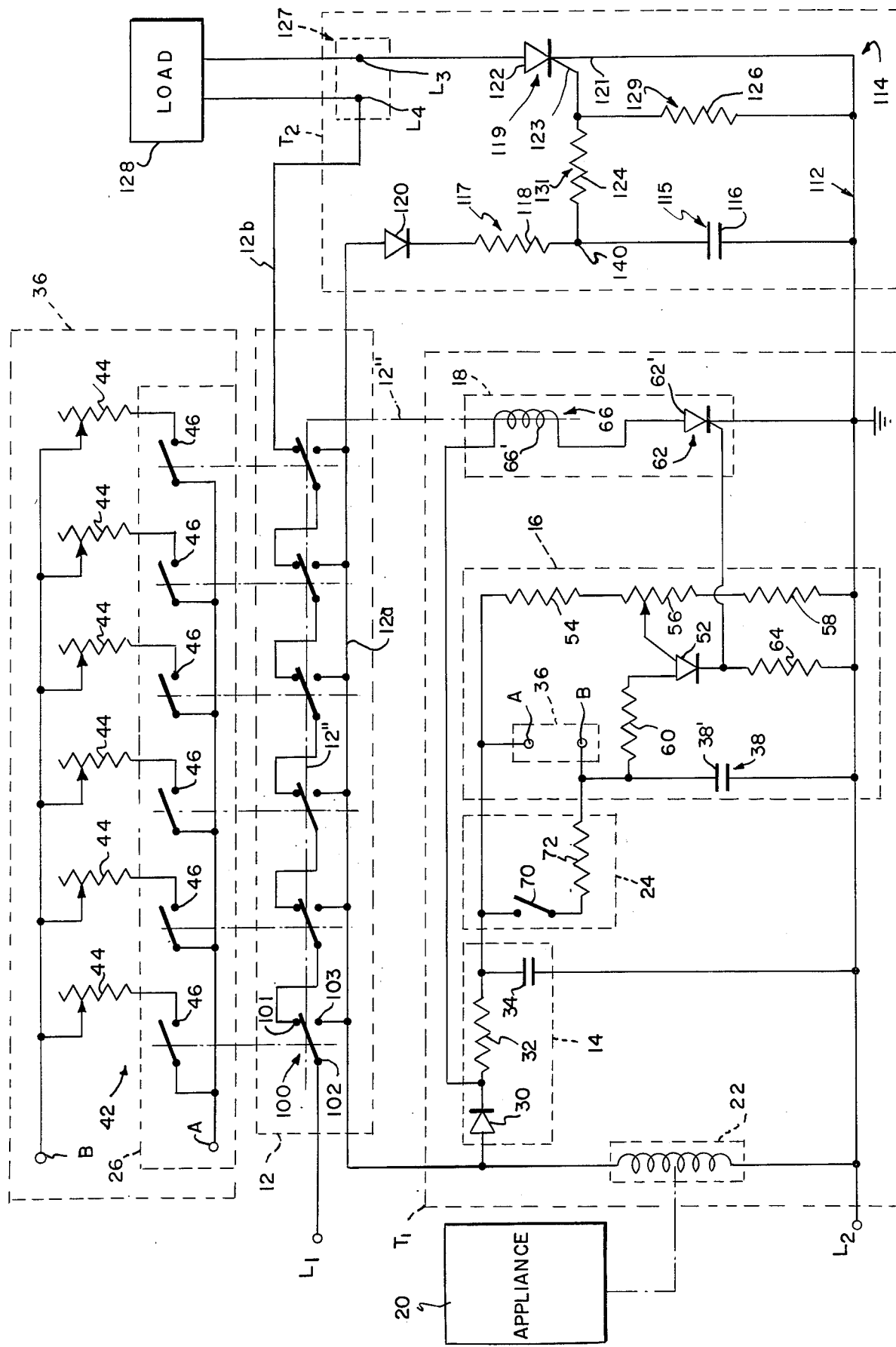

CONTROL CIRCUIT WITH END OF CYCLE INDICATION

This invention pertains to a control circuit and more particularly to a control circuit having two timing means connected by a switching means.

Generally speaking, the present invention relates to a control circuit which in general comprises a power switching means, a first timing means connected to one side of said power switching means including a power turn-off means connected to said one side of said power switching means, and a second timing means connected between said first and second sides of said power switching means, said power turn-off means further including means connected to said power switching means to actuate same.

Control circuits which incorporate timing means are extensively used to control the operational functions of appliances such as washers, dryers, ranges, ovens, and microwave ovens. In microwave ovens for example, a control circuit is needed to turn the oven on or off in accordance with a predetermined period of time. And in some applications of microwave ovens, it may be especially desirable to provide a means for indicating the end of the cooking cycle.

It is, therefore, a feature of the present invention to provide a control circuit which is particularly adaptable to a microwave oven and which includes a means to indicate the end of a cycle. Another feature of the invention is the provision of a control circuit which includes a power switching means and first and second timing means connected to the power switching means. Another feature of the invention is the provision of such a control circuit wherein one of the timing means energizes the power switching means to switch power such that an appliance is turned off and the second timing means is energized to energize an end of cycle indicator for a predetermined period of time. Still another feature of the invention is the provision of such a control circuit wherein the power switching means includes a bank of double pole switches wherein half the common poles are connected through a normally closed contact of a next succeeding switch. Yet still another feature of the invention is the provision of a control circuit having a power switching means, a first timing means connected to one side of the power switching means and having a power turn-off means connected to the one side of the power switching means and a second timing means connected between the first and second sides of the power switching means, the power turn-off means including a means connected to the power switching means to actuate same. Yet still another feature of the invention is the provision of such a control circuit wherein the first timing means includes a power switching means, a power supply means responsive to the power switching means, timing means responsive to the power supply means, and power turn-off means which is responsive to the timing means to selectively de-energize the power switching means. Another feature of the invention is the provision of such a control circuit wherein the second timing means includes a solid-state timer switch circuit utilizing a solid-state switching device such as a silicon-controlled rectifier, a transistor or a triac to supply power to a load for a predetermined period of time. These and other features of the invention will become apparent from the following description taken in conjunction with the accompanying drawing wherein the sole FIGURE is a wiring diagram illustrating the invention.

Referring now to the drawing the control circuit, in general, includes first and second timing means $T_1$ and $T_2$ connected to a power switching means 12, timer means $T_1$ connected to a common side 12a of the power switching means and timer means $T_2$ connected between the common side and a second side 12b.

Timer $T_1$ includes power supply means 14, timing means 16, and power turn-off means 18. The timer may, through the power switching means 12, activate an appliance 20, such as a microwave oven, through a relay means 22. As will become apparent, appliance 20 will be operable for a predetermined period of time until the power switching means 12 is de-energized through power turn-off means 18. A safety shut-off means 24 is responsive to a condition of the appliance 20 to activate timing means 16 thereby energizing power turn-off means which de-energizes the timer to shut-off power to the appliance. As shown, activation of power switching means 12 activates power supply means 14 which in turn activates timing means 16, timing means 16 operating power turn-off means 18. As will become apparent, timing means 16 includes a switching means 26. Although switching means 26 is functionally part of timing means 16, the switching means 26 should be constructed unitarily with power switching means 12. That is, the unitary construction of switching means 12 and 26 provides a double throw, double pole, single pole switch. Therefore, switching means 26 is activated when power switching means 12 is activated.

The timer $T_1$ is connected across a suitable power source at lines $L_1$, $L_2$. Power switching means 12 includes a plurality of switches which may be of the push button type having a double contact with one of the contacts serving as the power switching means. The other contact is connected to timer $T_2$. Power supply means 14 includes a series combination of diode 30, resistor 32, and capacitor 34. The power supply means converts AC current to DC current which is supplied to the balance of the circuit. Timing means 16 is a relaxation oscillator including timing selector means 36, capacitance means 38. The timing selector means 36 is connected between junctions A and B and includes a bank of potentiometers 42 such as a bank of variable resistors 44. The resistors 44 are electrically connected in series with contacts 46. In this manner, various resistance values may be obtained so as to vary the time periods that the timing means will be operable through the various combinations of the capacitor means 38 which includes a timing capacitor 38 and the variable resistors. Also included as part of the timing means 16 is a programmable unijunction transistor (PUT) 52 and a voltage divider network comprising resistors 54, 56, and 58, resistor 56 being a variable resistor. The gate of the programmable unijunction transistor is connected to the variable resistor 56, its anode is connected to junction B through load resistor 60 and its cathode is connected to the switching means 62 of the power turn-off means 18 and to ground through load resistor 64. The power turn-off means 18 includes solenoid means 66 connected in series with switching means 62. Relay means 66 includes a solenoid 66' while switching means 62 includes an SCR 62' connected anode to the solenoid, cathode to ground, and gate to timing means 16.

Where it is required for the particular appliance, a safety means may be included as part of the timer circuitry. For example, in a microwave oven, means may be provided to turn off the power to the complete system when the oven door is opened. As part of the present combination, a safety shut-off means 24 is included as part of the timing means 16; but it is to be understood that it need not be necessarily so included. Safety shut-off means 24 includes a suitable switch 70 responsive to a condition of the appliance in series with load resistor 72.

Timer $T_2$, comprising a solid-state timer switch circuit 114, is connected between sides 12a and 12b of power switching means 12. A capacitance means 115, comprising capacitor 116, is connected one side to the common side 112 of the circuit. A first resistance means 117, comprising resistor 118, is connected one side to the other side of capacitor 116. A diode 120 is connected cathode to the other side of resistor 118. A solid-state switching means 119 comprises a silicon-controlled rectifier (SCR) 122. SCR 122 is connected cathode 121 to the common side 112 of circuit 114. A second resistance means 131, comprising resistor 124, is connected one side to the gate 123 of SCR 122 and the other side to a junction 140 between capacitor 116 and resistor 118. A third resistance means 129, comprising resistor 126, is connected one end to the common side 112 of the circuit and the other end to the gate 123 of SCR 122.

A load-connecting means 127 comprises two terminals $L_3$ and $L_4$. A load 128, such as a buzzer, is connected to terminals $L_3$ and $L_4$. The anode 125 of SCR 122 is connected to terminal $L_3$.

In operation, power is applied to the circuit through connections $L_1$ and $L_2$, $L_2$ being common side of the power source. $L_1$ is applied through power switching means 12. $L_1$ is connected to common contact 102. With the switch in its normal position, contact 102 engages contact 101. Contact 101 connects to the common side of the next switch and so on until $L_1$ is applied to load 128. This load is not energized since SCR 122 is not turned on.

When switch 100 is operated, contact 102 is connected to contact 103. At this time power is removed from load 128. $L_1$ is now applied through contact 103 to power supply 14. $L_1$ is also applied through diode 30 to solenoid 66. However solenoid 66 is not energized since SCR 62 is turned off. At this time relay 22 which operates appliance 20 is energized.

In addition, $L_1$ is supplied to diode 120. This connection allows capacitor 115 to be charged via diode 120 and resistor 118 and also applies power to the gate of SCR 122. SCR 122 is turned on but load 128 is not energized since $L_1$ is no longer applied to connection $L_4$ through contact 100.

Power supply 14 supplies power to safety circuit 24 and timing means 16. At the same time switch 100 is operated, switch 36 is also operated. Switch 36 connects potentiometers 42 between points A and B in timing means 16 to start timing. When capacitor 38 has charged up to some preset voltage, PUT 52 turns on and a voltage is developed across resistor 64. This voltage is applied to the gate of SCR 62. SCR 62 now turns on and energizes solenoid 66. Solenoid 66 is connected to switches 36 and 12 through latch bar 12″ such that they can be reset to their normal positions. This removes power ($L_1$) from relay 22, power supply 14, solenoid 66 and diode 120.

Power ($L_1$) is reconnected to load 128. Load 128 is now energized for a predetermined time by SCR 122. SCR 122 is turned on by the charge stored in capacitor 115. When the voltage across capacitor 115 drops below that necessary to keep SCR 122 on, the SCR will turn off and deenergize load 128.

What is claimed is:

1. A control circuit comprising a power switching means; a first timing means including a power turn-off means connected to one side of said power switching means, a first load and actuation means connecting said first timing means to said first load; a second timing means including a solid state timer switch circuit utilizing a solid-state switching device connected between said one side and a second side of said power switching means; said power turn-off means further including means connected to said power switching means to actuate same; a second load, said second timing means including terminal means connecting said solid state switching device to said second load.

2. A control circuit according to claim 1 wherein said power switching means includes a bank of double pole switches wherein half the common poles are connected through a normally closed contact of a next succeeding switch.

3. A control circuit according to claim 1 wherein said first timing means includes a bank of switches connected to a resistor capacitor timing circuit and wherein said bank of switches is unitarily constructed with said power switching means to provide double throw, double pole, single pole switches.

4. A control circuit according to claim 3 wherein contacts of the double poles are connected to said first and second timing means and the single pole contacts are connected to said resistor-capacitor timing circuit.

5. A control circuit according to claim 1 wherein said first and second loads are a microwave oven and buzzer respectively.

6. A control means according to claim 1 wherein said power turn-off means includes a solenoid and wherein said means connected to said power switching means includes a latch bar connecting said power switching means to said power turn-off means.

* * * * *